(12) United States Patent
Ardakani et al.

(10) Patent No.: US 7,053,401 B2
(45) Date of Patent: May 30, 2006

(54) SYNTHESIS AND APPLICATION OF PHOTOSENSITIVE PENTACENE PRECURSOR IN ORGANIC THIN FILM TRANSISTORS

(75) Inventors: Ali Afzali Ardakani, Yorktown Heights, NY (US); Christos D. Dimitrakopoulos, Ossining, NY (US); Teresita O. Graham, Irvington, NY (US); David R. Medeiros, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 10/323,899

(22) Filed: Dec. 20, 2002

(65) Prior Publication Data

US 2004/0119073 A1 Jun. 24, 2004

(51) Int. Cl.
*H01L 35/24* (2006.01)

(52) U.S. Cl. .................. 257/40; 257/228; 257/431; 438/780; 430/270.1

(58) Field of Classification Search ............... 438/609, 438/780, 270.1; 430/270.1; 257/40, 66, 257/72, 99, 228, 431, 642

See application file for complete search history.

(56) References Cited

U.S. PATENT DOCUMENTS 6,452,207 B1 9/2002 Bao
2003/0144562 A1* 7/2003 Afali-Ardakani et al. ... 570/212

OTHER PUBLICATIONS

Afzali, A.; Dimitrakopoulos, C.D.;Breen, T.L.; High-Performance, Solution Processes Organic Thin Film Transistors from a Novel Pentacene Precursor, J. American Chemical Society, Jul. 9, 2002; No. 124, pp. 8812-8813.*
Herwig, P.T.; Müllen, K.; A Soluble Pentacene Precursor: Synthesys, Solid-State Conversion into Pentacene and Application in a Field-Effect Transistor; Advanced Materials, 1999, vol. 11, No. 6, pp. 480-483.*

* cited by examiner

*Primary Examiner*—Hoai Pham
*Assistant Examiner*—Ginette Peralta
(74) *Attorney, Agent, or Firm*—Wan Yee Cheung, Esq.; McGinn IP Law Group, PLLC

(57) ABSTRACT

Soluble, photosensitive precursors of pentacene are synthesized by a one-step Diels-Alder reaction of pentacene with N-sulfinylamides. These precursors may include a photopolymerizable group, which renders the pentacene precursor as a negative tone resist. The pentacene precursor may also include an acid-sensitive protecting group, which in the presence of a photoacid generator and upon exposure to UV light, is removed and the product becomes base soluble. Patterned pentacene thin films may be obtained by exposure to UV light through a mask and/or heating, and used as an active channel material for an organic field effect transistor.

16 Claims, 5 Drawing Sheets

SYNTHESIS AND APPLICATION OF PHOTOSENSITIVE PENTACENE PRECURSOR IN ORGANIC THIN FILM TRANSISTORS

BACKGROUND OF THE INVENTION

1. Field of the Invention

The present invention generally relates to the synthesis of a photosensitive precursor of pentacene. More particularly, this invention relates to using a pentacene thin film formed from a photothermal conversion of these precursors in the fabrication of organic thin film transistors. This invention also relates to patterning of thin films of these materials by exposure to ultraviolet (UV) light through a mask.

2. Description of the Related Art

Organic semiconductors have received increasing attention during the past two decades due to potential low cost applications in electronic devices (see R. H. Friend et al. Electroluminescence in conjugated polymers, Nature, 1999, 397, 121. and A. J. Heeger, Semiconducting and metallic polymers", Angew. Chem. Int. Ed., 2001, 40, 2591). The main applications of these compounds are seen in the field of light-emitting diodes (see, Leung, L. M. High efficiency blue emitter for small molecule-based organic light emitting diodes, J. Am. Chem. Soc., 2000, 122, 5640) and large area electronics (see, C. D. Dimitrakopoulos et al., Organic Thin Film Transistors for Large Area Electronics, Adv. Mater., 2002, 14, 99). Both applications require the organic semiconducting material to be patterned.

Unlike inorganic semiconductors, standard wet-process, lithographic techniques can not be used for organic semiconductors due to contamination of these materials by photoresists and/or developers used in patterning of the photoresists. Several techniques have been used for patterning of the organic semiconductors. One of the first approaches used for depositing a pattern with organic semiconductors was screen printing (see Garnier, F. et al., All-polymer field effect transistors, Science, 1994, 265, 1684). This approach is particularly desirable from the viewpoint of device fabrication because it is an additive process, wherein materials are deposited only where required. The drawbacks for screen printing of organic semiconductors are the limited resolution (50–200 micrometers) and the undesirably low solution viscosity of the organic semiconductors.

Another method of patterning organic semiconductors, which has gained considerable attention, is ink-jet printing. Ink-jet printing relies on the steering of material-containing droplets, discharged from a nozzle, and their contained impact and solidification onto a target substrate. This technique has been used in the fabrication of an all-polymer transistor circuits (see, Sirringhaus, H. et al., High resolution ink-jet printing of all-polymer transistor circuits, Science, 2000, 290, 2123) with a maximum resolution of about 25 micrometer.

Finally, photochemical patterning which is the process used in imaging the inorganic semiconductors by using a photoresist material, has been reported for the patterning of π-conjugated polymers. For example, a polythiophene with a pendant tetrahydropyranyl (THP) functionality was patterned using a "chemical amplification" method (see Yu, J. et al., Chemically amplified photolithography of a conjugated polymera, Chem. Commun., 1998, 1503). In this example as shown in Scheme I, thin films of poly(3-(2-(2-tetrahydropyranyloxy)ethyl)thiophene) are deposited together with a photoacid generator. This thin film is thermally stable up to 200° C. However, when acid is generated in the film by exposure to UV light, catalytic cleavage of the tetrahydropyranyl group occurs at 100° C. and the polymer is rendered insoluble.

Scheme I

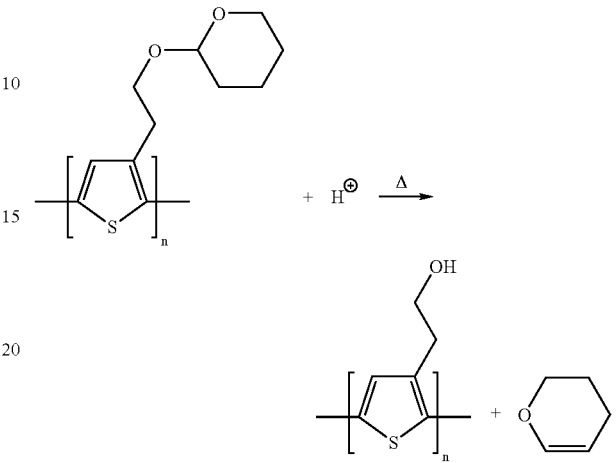

This approach to patterning, which has been used for substituted polythiophenes and poly(phenylenevinylene), in principle results in high resolution patterning of conjugated polymers but the polymers have very low electrical charge (field-effect) mobility.

SUMMARY OF THE INVENTION

In view of the foregoing and other problems and disadvantages of conventional techniques, an aspect of the present invention is to provide a simple high-yield synthesis of photosensitive materials, which can be used in the patterning of organic semiconductors with high electrical charge mobility. Another aspect of the present invention is that these photosensitive materials are soluble in common organic solvents and that the development of the photoimagable materials also employs common, environmentally-friendly solvents. Another aspect of the present invention is the use of the photosensitive materials for patterning a pentacene thin film as an active channel material in an organic thin film transistor (OTFT) and circuitry using OTFTs.

In order to attain the above and other advantages, according to an exemplary embodiment of the present invention, disclosed herein is a photosensitive compound formed by a Diels-Alder adduct of a polycyclic aromatic compound and a dienophile, wherein the polycyclic aromatic compound is represented by the formula

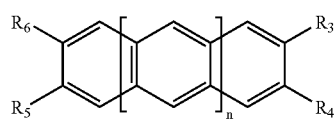

and n is at least 2, wherein the dienophile is represented by the formula $R^1$—X=Y—$R^2$ and at least one of X and Y is a hetero atom comprising one of N, O, and S, and wherein at least one of R1 and R2 has a photosensitive functionality or an acid labile group.

In another exemplary embodiment of the present invention, each of R3, R4, R5, and R6 comprises a group including hydrogen, alkyls of 1–12 carbon atoms, aryls, substituted aryls, and a group in which R3 and R4 form one or more fused aromatic-rings.

In another exemplary embodiment of the present invention, each of X and Y comprises one of $CR^7$, N, O, S, SO, and $SO_2$, and each of $R^1$, $R^2$, and $R^7$ comprises one of hydrogen, alkyls of 1–12 carbon atoms, aryls, substituted aryls, aralkyls, alkoxycarbonyls, aryloxycarbonyls, and acyls.

In another exemplary embodiment of the present invention, the acyls are represented by the formula $R^8CO—$, and $R^8$ comprises one of hydrogen, alkyls of 1–12 carbon atoms, aryls, aralkyls, fluoroalkyls, and substituted aryls, in which the substituted aryls have a substituent comprising one of F, Cl, Br, $NO_2$, $CO_2R$, $PO_3H$, $SO_3H$, trialkylsilyl, and acyl.

In another exemplary embodiment of the present invention, the photosensitive functionality represents a photopolymerizable group comprising one of acrylates, methacrylates, styryls, substituted styryls, and ethynylaryls, in which the ethynylaryls comprise one of ethynylphenyl, ethynylthiophene, and ethynylpyridine.

In another exemplary embodiment of the present invention, the acid labile group comprises one of tetrahydropyranyl, tert-butyloxycarbonyl, and 1-methylcyclopentyl, and the acid labile group is a protecting group for phenols, substituted phenols, alkyl carboxylic acids, and aryl carboxylic acids.

In another exemplary embodiment of the present invention, a photosensitive compound is formed by a Diels-Alder adduct of a polycyclic aromatic compound and a dienophile, the compound being represented by the formula

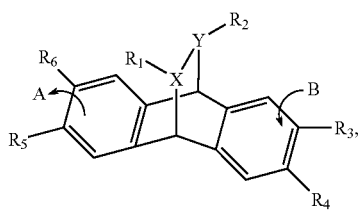

wherein each of A and B are aromatic ring compounds comprises one of benzene, naphthalene, anthracene, and phenanthrene, or heteroaromatic ring compounds comprising one of thiphene, bithiophene, benzothiophene, and pyridine, wherein at least one of X and Y is a hetero atom comprising one of O, N or S, and wherein at least one of $R^1$ and $R^2$ has a photosensitive functionality or an acid labile group.

In another exemplary embodiment of the present invention, each of R1 and R2 comprises one of hydrogen, alkyls of 1–12 carbon atoms, aryls, substituted aryls, aralkyls, alkoxycarbonyls, aryloxycarbonyls and acyls, the acyls being represented by the formula $R^8CO—$, in which $R^8$ comprises one of hydrogen, alkyls of 1–12 carbon atoms, aryls, aralkyls, fluoroalkyls, and substituted aryls, in which the substituted aryls have a substituent comprising one of F, Cl, Br, $NO_2$, $CO_2R$, $PO_3H$, $SO_3H$, trialkylsilyl, and acyl.

In another exemplary embodiment of the present invention, each of R3, R4, R5, and R6 comprises a group including hydrogen, alkyls of 1–12 carbon atoms, aryls, substituted aryls, and a group in which R3 and R4 form one or more fused aromatic-rings.

In another exemplary embodiment of the present invention, the photosensitive functionality represents a photopolymerizable group comprising one of acrylates, methacrylates, styryls, substituted styryls, and ethynylaryls, in which the ethynylaryls comprise one of ethynylphenyl, ethynylthiophene, and ethynylpyridine.

In another exemplary embodiment of the present invention, the acid labile group comprises one of tetrahydropyranyl, tert-butyloxycarbonyl, and 1-methylcyclopentyl, and the acid labile group is a protecting group for phenols, substituted phenols, alkyl carboxylic acids, and aryl carboxylic acids.

In another exemplary embodiment of the present invention, a photosensitive compound is formed by a Diels-Alder adduct of a pentacene and a dienophile, wherein the dienophile is N-sulfinylamide and the adduct has the structure

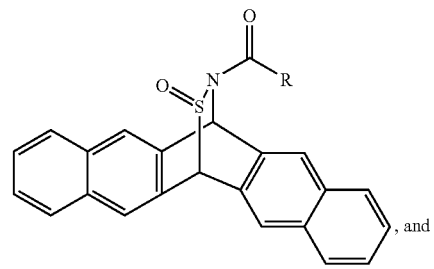

, and wherein R comprises a photosensitive group comprising one of vinyl, 2-propenyl, substituted vinyl, substituted 2-propenyl, partially- or fully-fluorinated vinyl, partially- or fully-fluorinated 2-propenyl, styryl, fluorinated styryl, ethynylphenyl, and substituted ethynylphenyl, or an acid labile group comprising one of (1) O-tert-butyloxycarbonylhydroxyphenyl, (2) O-tetrahydropyranylhydroxyphenyl, (3) tert-butyloxy, (4) cyclopentyloxy, and (5) 2-methylcyclopentyloxy, as depicted, respectively, below

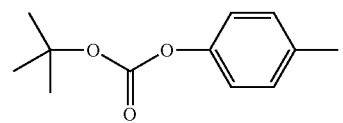

1

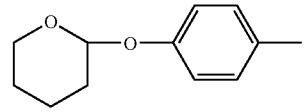

2

3

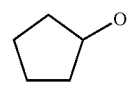

4

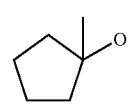

5

In another exemplary embodiment of the present invention, the dienophile is thioxocarboxylate and the adduct has the structure

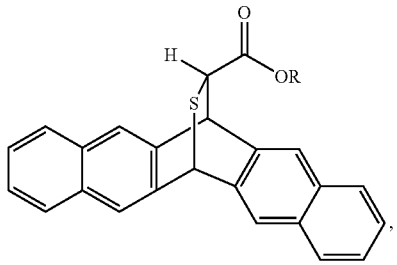

or a sulfur atom of the thioxocarboxylate is oxidized to a corresponding sulfoxide and the adduct has the structure

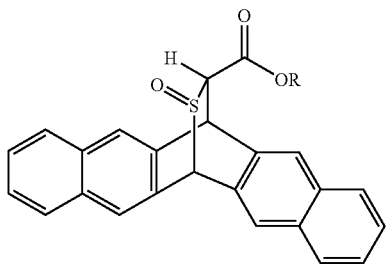

wherein the R-group comprises an acid labile group comprising one of tertbutyl, 2-methylcyclopentyl, and cyclopentyl groups, or a photosensitive group comprising one of methacrylate, acrylate, styryl, ethynylphenyl, and ethynyl-substituted heteroaromatics.

In another exemplary embodiment of the present invention, the dienophile is thioxomalonate and the adduct has the structure

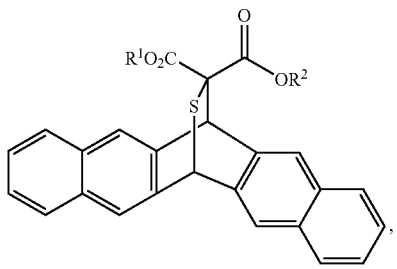

wherein at least one of the $R^1$ and $R^2$ comprises a photosensitive group or an acid labile group.

In another exemplary embodiment of the present invention, the dienophile is a nitroso compound and the adduct has the structure

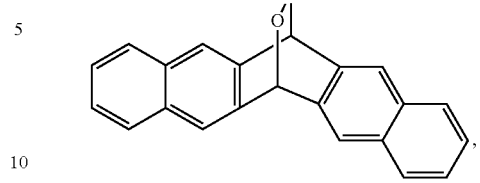

wherein the R group is one of a photosensitive group or an acid labile group, or the dienophile is an azidodicarboxylate and the adduct has the structure

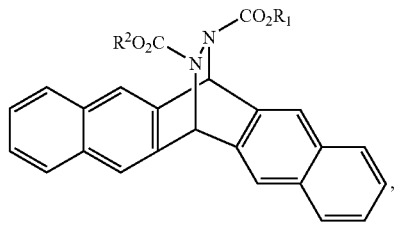

wherein at least one of $R_1$ and $R^2$ is a photosentive group or an acid labile group.

In another exemplary embodiment of the present invention, a photosensitive compound is formed by a Diels-Alder adduct of a polycyclic aromatic compound and a heterodienophile having the structure

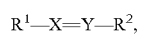

wherein each of X and Y comprise one of $CR^3$, O, N, and S and at least one of X and Y is a hetero atom of O, N, and S, wherein each of $R^1$ and $R^2$ comprise one of hydrogen, alkyl groups of 1–12 carbon atoms, partially- or fully-fluorinated alkyls of 1–12 carbon atoms, acyls, aryls, aralkyls, phosphonates, carboxylates, and wherein at least one of $R^1$ and $R^2$ comprises a photosensitive group or an acid labile group.

In another exemplary embodiment of the present invention, a method of making a photosensitive compound is provided, the method comprising a Diels-Alder reaction between a polycyclic aromatic compound represented by the formula

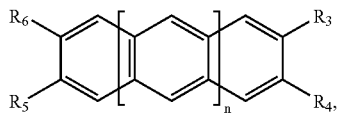

in which n is at least 2, and a dienophile represented by the formula:

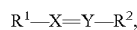

in which at least one of X and Y is a hetero atom selected from the group consisting of N, O, and S, wherein each of $R^1$ and $R^2$ comprises at least one of a photosensitive group and an acid labile group.

In another exemplary embodiment of the present invention, the polycyclic aromatic compound used in the method is pentacene and the Diels-Alder reaction is represented by the scheme

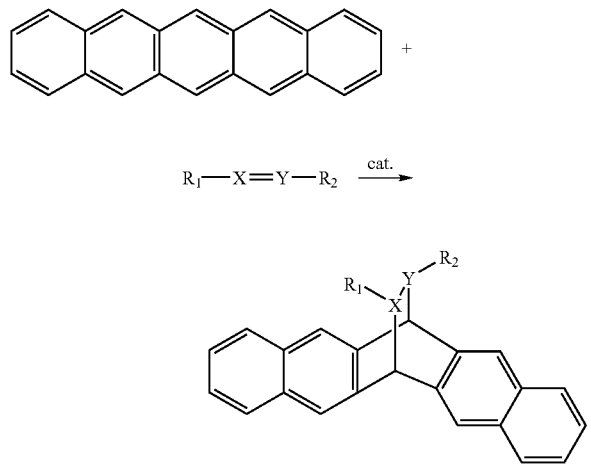

In another exemplary embodiment of the present invention, a method of preparing a substrate having thereon a patterned organic semiconductor layer is provided, in which the method comprises depositing a thin layer of a photosensitive organic semiconductor on the substrate, exposing the photosensitive organic semiconductor, deposited as the thin layer, to UV radiation through a mask to form a patterned substrate, heating the patterned substrate to about 80° C. to about 200° C. for a duration of about 10 seconds to about 2 hours, and developing the patterned substrate by contacting the patterned substrate to a solvent, which removes unexposed organic semiconductor material.

In another exemplary embodiment of the present invention, the photosensitive organic semiconductor is a Diels-Alder adduct of a polycyclic aromatic compound and a dienophile, wherein the polycyclic aromatic compound is selected from the group including polyacenes and oligothiophenes, and the dienophile is represented by the formula

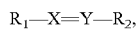

wherein at least one of X and Y is a hetero atom comprising one of N, O, and S, and at least one of R1 and R2 comprises a photosensitive functionality or an acid labile group.

In another exemplary embodiment of the present invention, the photosensitive organic semiconductor has the structure

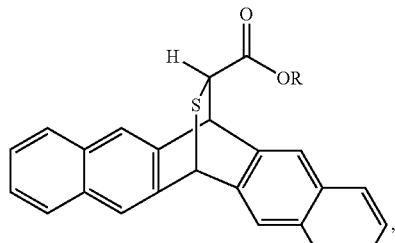

or the structure

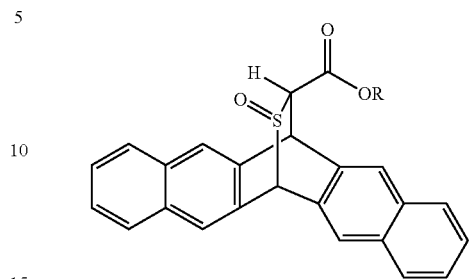

wherein the R-group comprises an acid labile group comprising one of tertbutyl, 2-methylcyclopentyl, and cyclopentyl groups, or a photosensitive group comprising one of methacrylate, acrylate, styryl, ethynylphenyl, and ethynyl-substituted heteroaromatics.

In another exemplary embodiment of the present invention, the photosensitive organic semiconductor has the structure

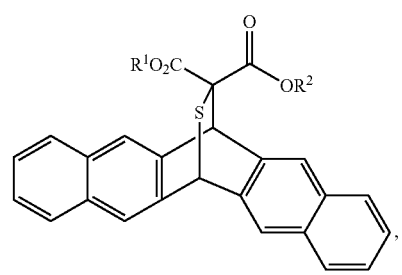

wherein at least one of the $R^1$ and $R^2$ comprises a photosensitive group or an acid labile group.

In another exemplary embodiment of the present invention, the photosensitive organic semiconductor has the structure

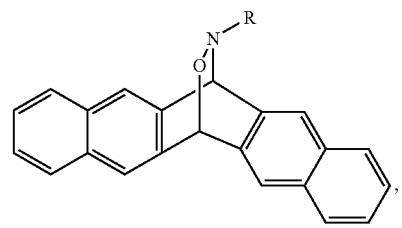

wherein the R group is one of a photosensitive group or an acid labile group, or the dienophile is an azidodicarboxylate and the adduct has the structure

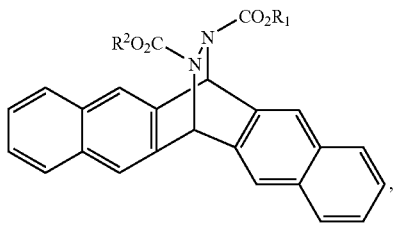

wherein at least one of $R_1$ and $R^2$ is a photosentive group or an acid labile group.

In another exemplary embodiment of the present invention, the photosensitive compound is formed by a Diels-Alder adduct of a polycyclic aromatic compound and a heterodienophile having the structure

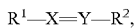

wherein each of X and Y comprise one of $CR^3$, O, N, and S and at least one of X and Y is a hetero atom of O, N, and S, wherein each of $R^1$ and $R^2$ comprise one of hydrogen, alkyl groups of 1–12 carbon atoms, partially- or fully-fluorinated alkyls of 1–12 carbon atoms, acyls, aryls, aralkyls, phosphonates, carboxylates, and wherein at least one of $R^1$ and $R^2$ comprises a photosensitive group or an acid labile group.

In another exemplary embodiment of the present invention, the photosensitive compound is a Diels-Alder adduct of a polycyclic aromatic compound represented by the formula

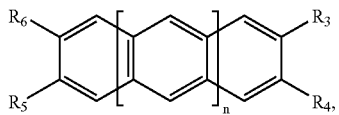

in which n is at least 2, and a dienophile represented by the formula:

in which at least one of X and Y is a hetero atom selected from the group consisting of N, O, and S, wherein each of $R^1$ and $R^2$ comprises at least one of a photosensitive group and an acid labile group.

In another exemplary embodiment of the present invention, the photosensitive compound is formed by the Diels-Alder adduct of pentacene and a dienophile, where the reaction is represented by the scheme

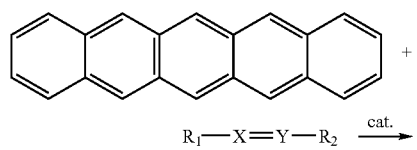

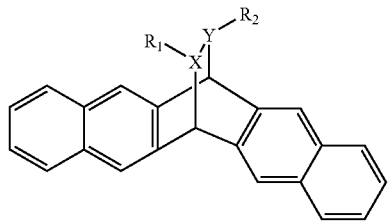

Thus, the present invention provides a simple high-yield synthesis of photosensitive materials, which may be patterned, to provide organic semiconductors with high electrical charge mobility. These photosensitive materials may be used to pattern a pentacene film, which acts as an active channel in an organic thin film transistor.

BRIEF DESCRIPTION OF THE FIGURES

The foregoing and other aspects of the present invention will be better understood from the following detailed description of a preferred embodiment of the present invention with reference to the figures, in which.

DETAILED DESCRIPTION OF PREFERRED EMBODIMENTS OF THE INVENTION

Figure 1:
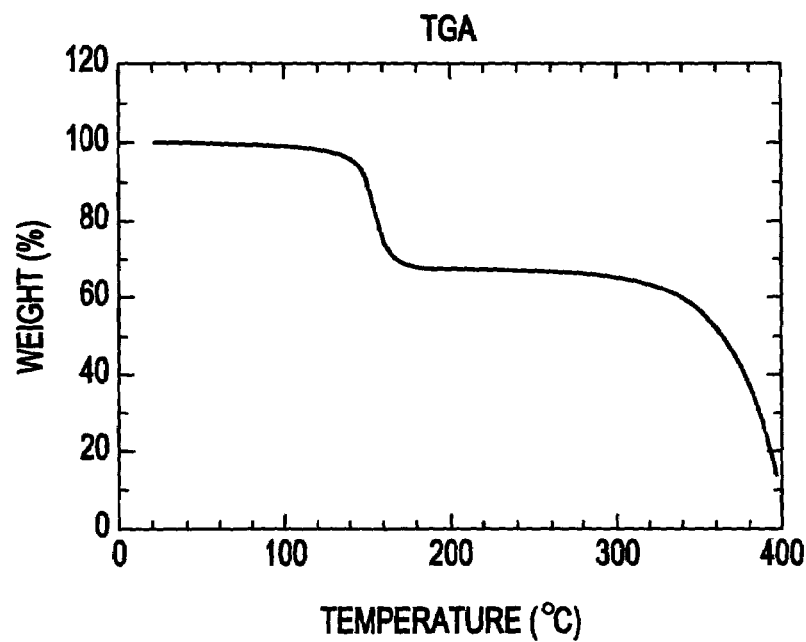
FIG. 1 illustrates thermogravimetric analysis curves for pentacene-N-sulfinylmethacrylamide adduct in an exemplary embodiment of the present invention.

Generally, the present invention takes advantage of photosensitive materials, which are soluble, photosensitive precursors of pentacene. These photosensitive materials are prepared in a one-step synthesis by a Lewis acid-catalyzed, Diels-Alder reaction of pentacene with variety of hetero-dienophiles as reported by Azali, A. et al., J. Am. Chem. Soc., 2002, 124, 8812. In particular, these hetero-dienophiles consist of N-sulfinylamides containing photosensitive functionalities. These N-sulfinylamides are prepared by a high yield conversion of the corresponding amides. The photosensitive functionalities of these N-sulfinylamides may be chosen from either photopolymerizable groups, for example, acrylates and methacrylates, or acid labile groups, for example, tert-butyloxycarbonylphenols, which undergo deprotection photothermally in the presence of a photoacid generator (PAG). The photosensitive pentacene precursors of this invention may be soluble in common organic solvents, for example, acetone, tetrahydrofuran, ethyl acetate, and chlorinated solvents, and may be patterned photothermally, for example, by UV irradiation through a mask, followed by heating at moderate temperatures, to a high resolution, for example, a minimum of 1 µm. Thus, the patterned pentacene thin films obtained by photothermal imaging may then be used to fabricate organic thin film transistors, in which pentacene may act as p-type active-channel material.

In an exemplary embodiment of the present invention, the soluble photosensitive pentacene precursors, having a photopolymerizable pendant group, are prepared by a Lewis acid-catalyzed, hetero-Diels-Alder reaction of pentacene and N-sulfinylamide. The N-sulfinylamides with various photosensitive groups may in turn be synthesized from their corresponding amide groups. This general synthetic approach is depicted in the following Scheme (Scheme II).

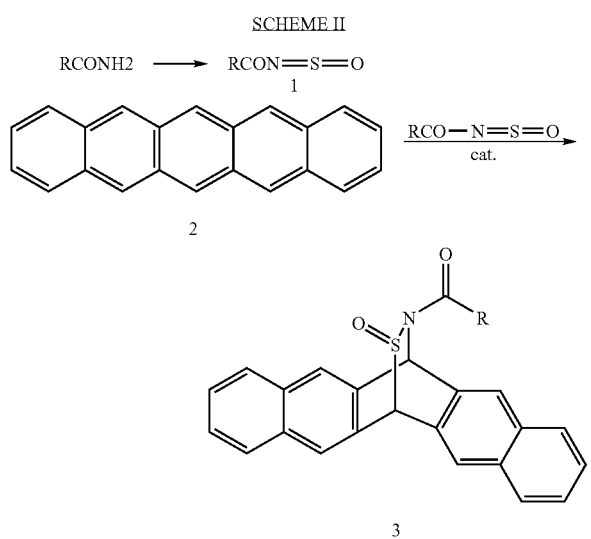

The R-group of the amides (and hence, the precursor) may be chosen from vinyl, propeny, or styryl groups so that precursor ends up with a acrylate, methacryalte, or styrenic groups, which are photopolymerizable, and therefore can be imaged and patterned by UV irradiation. These precursor compounds, which contain a photopolymerizable pendant group, may act as a negative tone resist material, which means the exposed area of the thin film becomes less soluble or more adherent to the substrate and remains on the substrate after exposure, heat, and washing. This process is depicted in Scheme III as follows.

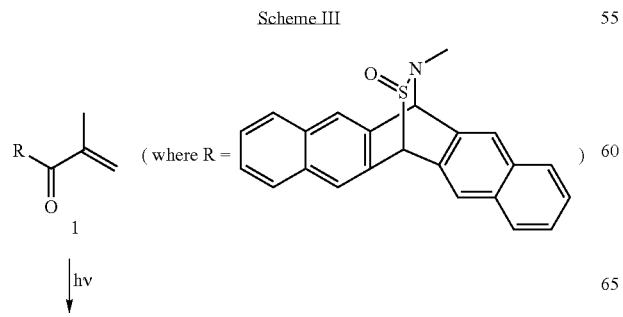

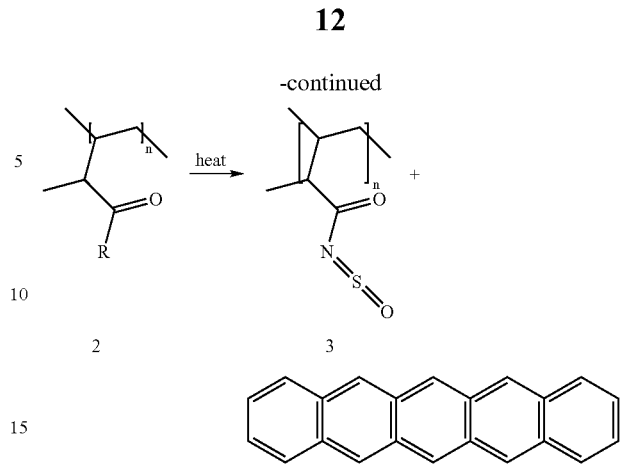

Scheme III shows the results of UW irradiation, whereby a methacrylate functionality, for example, undergoes polymerization resulting in poly(methacrylate) 1 having a pentacene precursor as pendant group, which is less soluble than a monomeric pentacene precursor 1, that can be washed away selectively after exposure in an non-UV imaged area (monomeric precursor). Alternatively, after exposure to UV radiation, the substrate may be heated to convert the non-imaged area to pentacene, and the imaged area to pentacene and poly(methacrylate) having a sulfinylamide pendant group 3. In this case, although the pentacene film of the non-imaged area is not soluble, due to its lack of adhesion to the substrate, it may selectively be removed from the substrate by, for example, agitation or sonication, in a solvent, for example, ethanol, methanol, acetone, and other organic solvents well known in the art, thus, leaving behind the imaged area, which comprises a mixture of pentacene and poly(methacryalte) as depicted in Scheme III.

In various exemplary embodiments, other functionalities, which are useful for a negative tone photosensitive pentacene precursor, are, for example, areacrylate, styryl, and ethynyl functionalities as shown in the following structures.

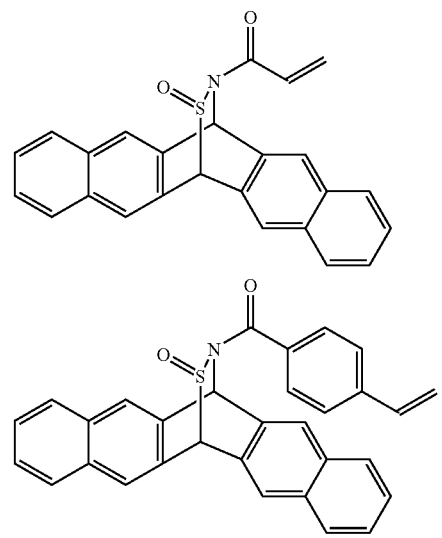

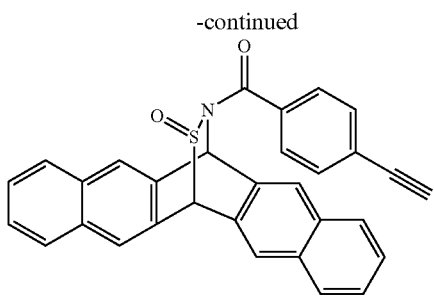

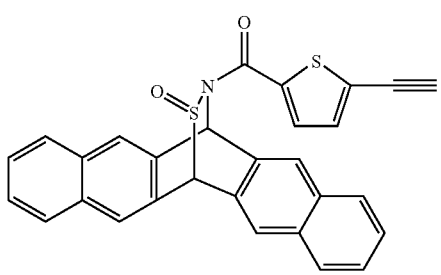

For a positive-tone photosensitive pentacene precursor, the pendant group on the starting amide (or N-sulfinylamide) must have an acid-labile group, which in the presence of a photoacid generator (PAG) may be removed photothermally to render the remaining molecular base soluble. In an exemplary embodiment of the present invention, this class of molecules may include O-tert-butyloxycarbonylphenols, which undergo deprotection to phenols, i.e., base soluble, by heating in the presence of an acid catalyst.

A general acid-catalyzed phenol deprotection is shown below in Scheme IV.

Scheme IV

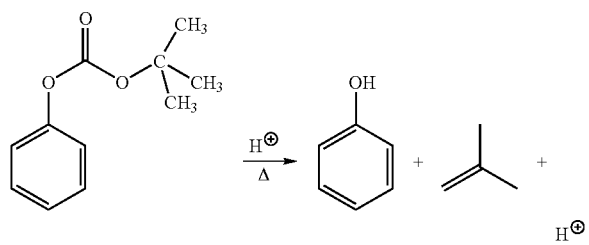

The same approach may be used to obtain a photosensitive positive-tone pentacene precursor. For example, 4-hydroxybenzamide is converted to a corresponding tert-butyloxycarbony amide, which in turn is transformed to its N-sulfinylamide derivative.

A Diels-Alder reaction of O-tert-butyloxycarbonyl-N-sulfinylbenzamide 3, as shown in Scheme V below, with pentacene results in the formation of an adduct 4 with an acid-labile tert-butyloxycarbonyl group, which may be deprotected to a base soluble phenolic adduct 5 by exposure to UV in the presence of a photoacid generator.

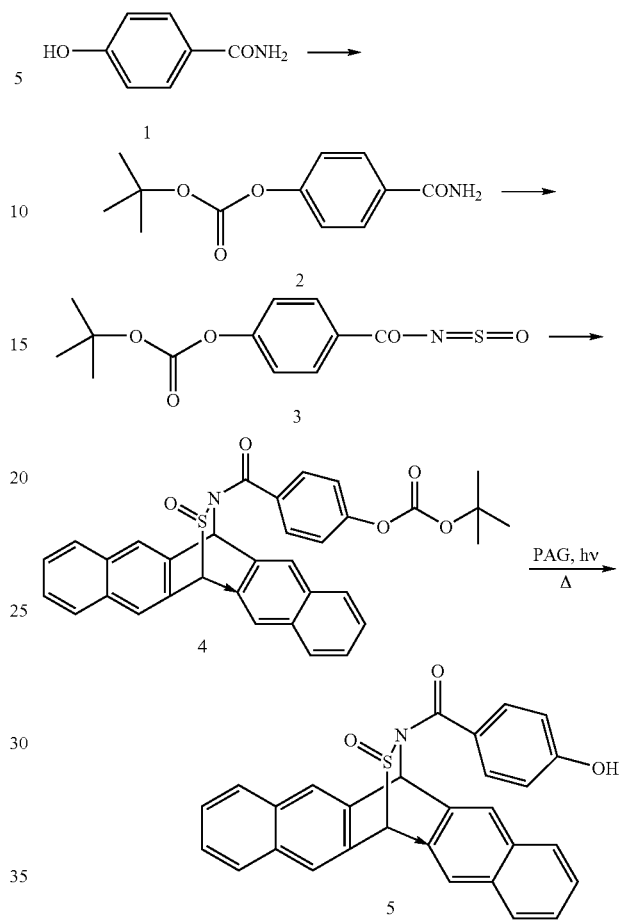

EXAMPLES

N-sulfinylmethacrylamide. In various exemplary embodiments, thionyl chloride (3.0 grams, 0.025 mole) is added to a solution of imidazole (6.8 grams, 0.1 mole) in 100 mL of anhydrous dichloromethane kept at −10° C. The solution is stirred for 20 minutes and the solid is filtered off and washed with anhydrous dichloromethane. The combined dichloromethane solutions are transferred to a flask and cooled to −10° C. To these solutions are added 3.0 grams of thionyl chloride that is stirred at −10° C. for 20 minutes and added dropwise to an ice-cold solution of methacrylamide (0.05 mole) in 100 mL of anhydrous dichloromethane. After stirring for 30 minutes, the solid is filtered, and washed with dichloromethane. The combined dichloromethane solutions are evaporated at a reduced pressure and the oily residue is distilled under vacuum to give N-sulfinylmethacrylamide, as light yellow oil, B.P. 40–45° C. at 0.2 mmHg.

Figure 2:
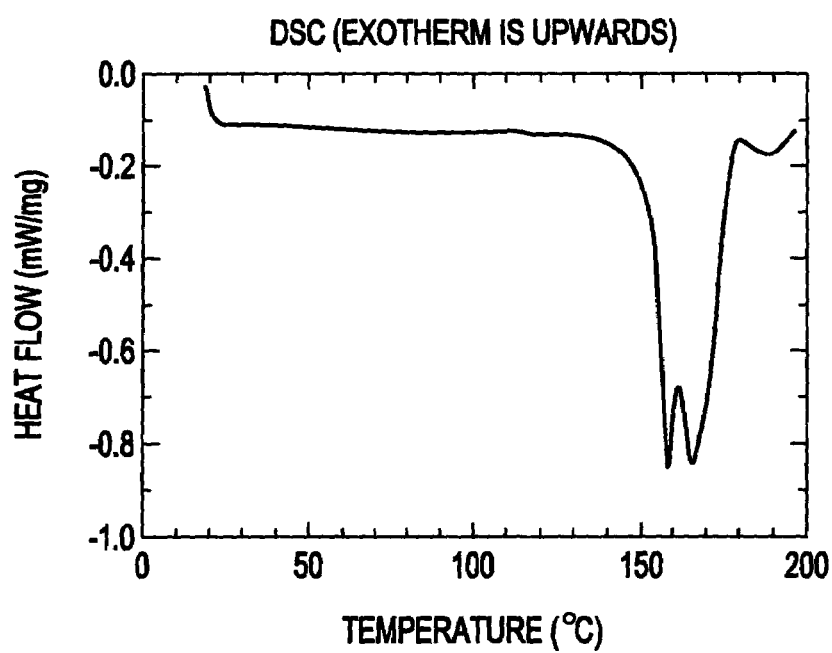
FIG. 2 illustrates differential scanning calorimeter curves for pentacene-N-sulfinylmethacrylamide adduct in an exemplary embodiment of the present invention.

Photosensitive precursor. In various exemplary embodiments, N-sulfinylmethacrylamide (1.3 gram, 0.01 mole) is added to a suspension of pentacene (834 mg, 3 mmole) in 50 mL anhydrous methylene chloride and the solution is cooled to 0–40° C. To this solution is added dropwise a 1 molar solution of, for example, any one of tin tetrachloride, titanium tetrachloride, silver trifluoroacetate, silver tetra fluoroborate, methyl rhenium trioxide, and functionally equivalent palladium compounds well known in the art, in methylene chloride (3 mL). After completion of the addition, the solution is gradually warmed to room temperature and stirred for a half hour. Water (10 mL) is added and the methylene chloride is separated and washed with water and brine, dried over anhydrous magnesium sulfate, and the solvent is evaporated under reduced pressure. The solid residue is chromatographed on a column of silica gel and eluted with methylene chloride and 1% methanol in methylene chloride. The product (compound 1 in scheme III) is obtained in 85% yield as a white crystalline solid, m.p. 158–159° C., decomposition temperature 165° C. as shown by its differential scanning calorimeter curve in FIG. 2., which shows an IR (KBr), ν ($cm^{-1}$), 1665, 1328, 119 and 1205. The retro Diels-Alder reaction, i.e., the thermal conversion to pentacene, is shown by its thermogravimetric analysis (TGA) curve, as shown in FIG. 1, which shows a weight loss of about 32% starting from 120° C. and reaching a plateau at 160° C.

Photothermal imaging. A solution of the adduct of pentacene and N-sulfinylmethacrylamide (compound 1, scheme III) in chloroform (20 mg/mL) is spin-coated on a substrate to form a thin film of 50–100 nm thickness. After evaporation of the solvent, the substrate is exposed to broad band UV radiation through a mask. A radiation dose of from about 10 to about 1000 $mJ/cm^2$ may be used depending on the thickness of the thin film. After UV exposure, the substrate is heated on a hot plate, for example, at 130° C. for one hour, to develop an image. The non-imaged area is then washed away from the substrate by immersion and agitation in a solvent, for example, methanol, ethanol, acetone and other organic solvents well known in the art.

Figure 3:
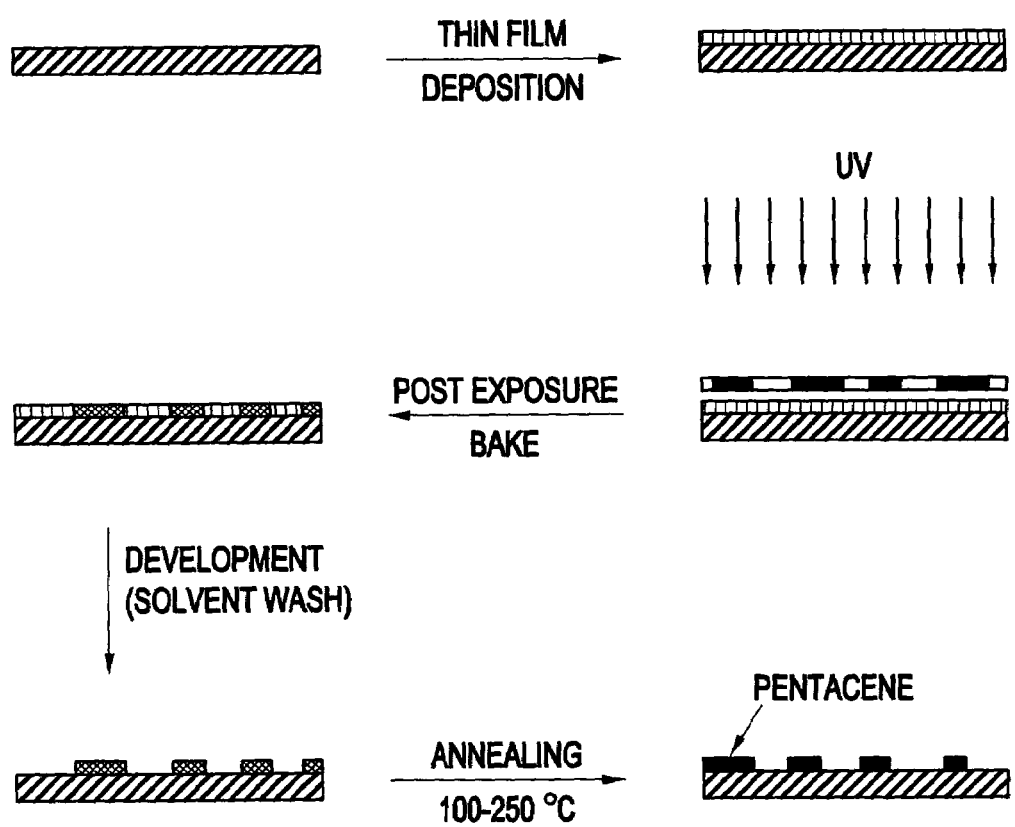
FIG. 3 illustrates a flow chart for the process of patterning a photosensitive precursor in an exemplary embodiment of the present invention.
Figure 4:
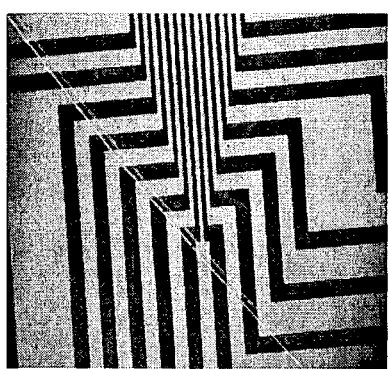
FIGS. 4a and 4b illustrate optical micrographs of a patterned photosensitive precursor in an exemplary embodiment of the present invention.
Figure 4:
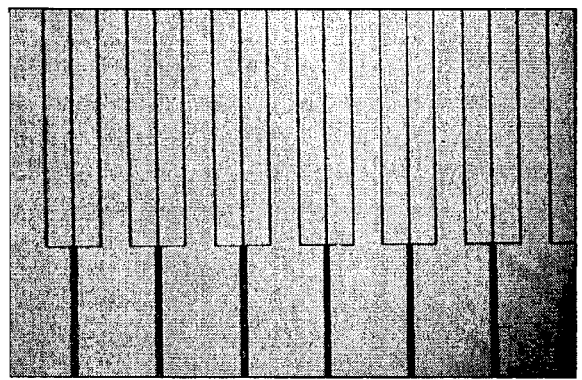

A flow chart of an exemplary embodiment of thin film deposition and patterning of the pentacene thin film through a photosensitive precursor is shown in FIG. 3. FIGS. 4*a* and 4*b* illustrate high resolution images of pentacene embedded in a polymer film.

Figure 5:
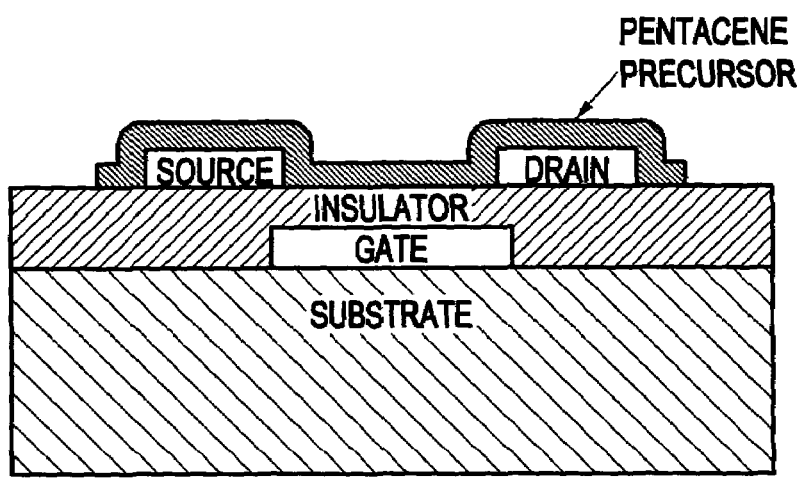
FIG. 5 illustrates a configuration of a thin film transistor device with an organic semiconductor in an exemplary embodiment of the present invention.

Device fabrication. A solution of the adduct (compound 1, scheme III) in propyleneglycol monomethylether acetate (PGMEA) is spin-coated onto a highly-doped silicon wafer having a top layer of $SiO_2$ with a thickness of, for example, about 300 to about 500 nm and predeposited source and drain electrodes as shown in FIG. 5. After evaporation of the solvent, the substrate is exposed to broad band UV radiation through a mask, which has an opening corresponding to the channel area. After exposure, the substrate is heated on a hot plate at, for example, 110° C. for 2 hours, and then rinsed in methanol with agitation to wash away the non-imaged area.

Alternatively, after exposure to UV radiation, the substrate is heated for a short period, for example, about 30 to about 60 seconds at about 100 to about 110° C., and developed (non-image areas are washed away) by suitable solvents, for example, methanol, acetone, ethanol and other organic solvents well known in the art, and then heated at for example, about 120 to about 200° C. for a period of, for example, about 10 seconds to about 2 hours to convert the precursor to pentacene.

Figure 6A:
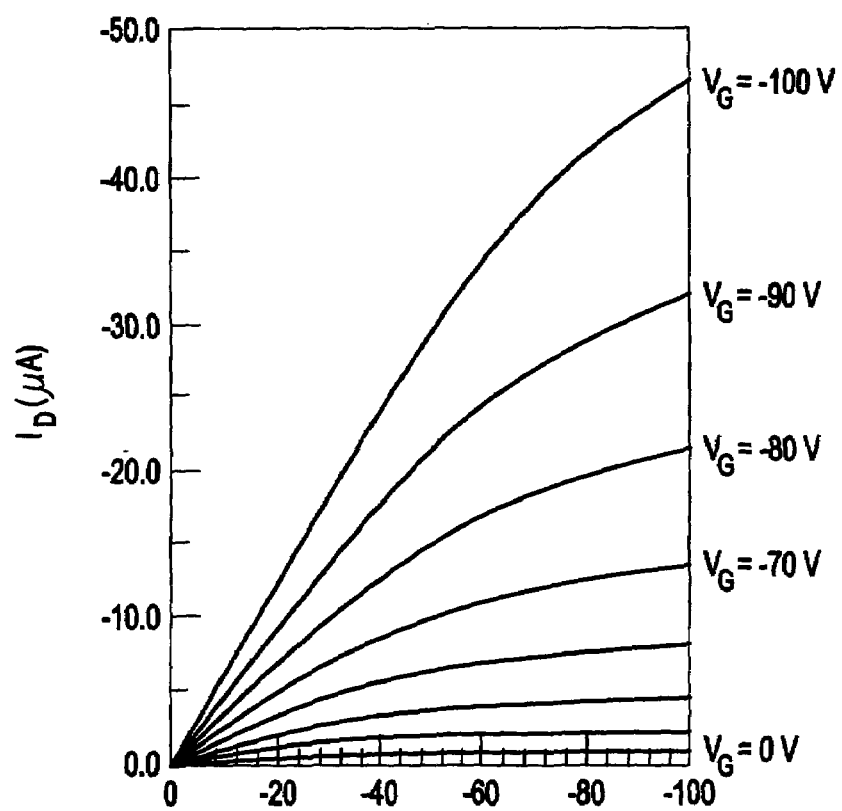
FIGS. 6a, 6b, and 6c illustrate drain and gate sweep curves (I/V) of an organic thin film transistor (OTFT) fabricated by using a photoimaged pentacene precursor in an exemplary embodiment of the present invention.
Figure 6B:
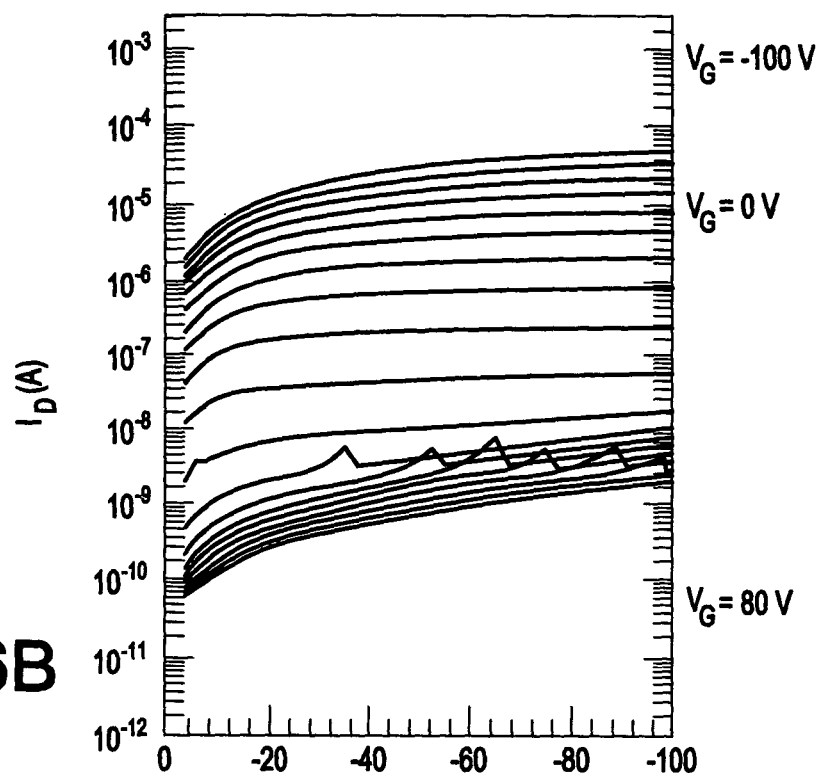
Figure 6C:
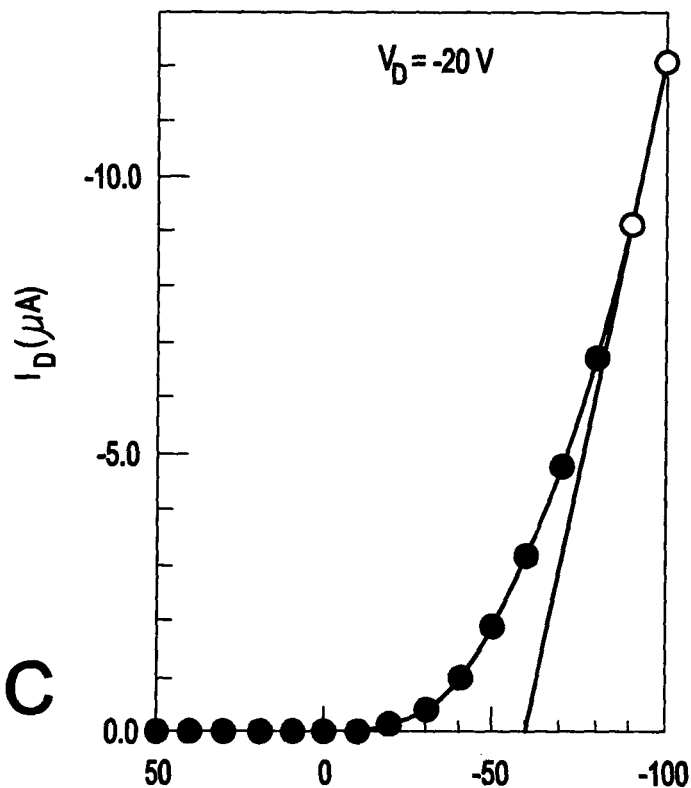

In both methods, a thin film of pentacene, embedded in a polymer film, forms in the channel area. The organic thin film transistor formed from photopatterning of the photosensitive pentacene precursor shows typical plot of drain current $I_D$ versus drain voltage $V_D$ at various gate voltages $V_G$ as shown in FIG. 6*a*. The field effect mobility was calculated in the linear regime from the transconductance to be about 0.05 $cm^2/V.sec$. FIG. 6*c* shows a graph that contains a semilogarithmic plot of $-I_D$ versus $V_G$ and a plot of $(-I_D)^{1/2}$ versus $V_G$ and the mobility calculated in the saturation regime is equal to about 0.055 $cm^2.V^{-1}s^{-1}$. The current modulation, which is the ratio of the current in accumulation over the current in depletion, also referred to as the $I_{on}/I_{off}$ ratio, is greater than $10^5$ as shown in FIG. 6*b*.

While the invention has been described in terms of exemplary embodiments, those skilled in the art will recognize that the invention can be practiced with modifications within the spirit and scope of the appended claims.

Further it is noted that Applicants' intent is to encompass equivalents of all claim elements, even if amended later during prosecution.

We claim:

1. A photosensitive compound formed by a Diels-Alder adduct of a polycyclic aromatic compound and a dienophile, wherein the polycyclic aromatic compound is represented by the formula

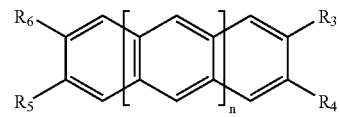

and n is at least 2,
wherein the dienophile is represented by the formula

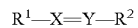

and at least one of X and Y is a hetero atom comprising one of N, O, and S, and
wherein at least one of R1 and R2 has at least one of a photosensitive functionality and an acid labile group.

2. The photosensitive compound of claim 1, wherein each of R3, R4, R5, and R6 comprises a group including hydrogen, alkyls of 1–12 carbon atoms, aryls, substituted aryls, and a group in which R3 and R4 form one or more fused aromatic-rings.

3. The photosensitive compound of claim 2, wherein the photosensitive functionality represents a photopolymerizable group comprising one of styryls, substituted styryls, and ethynylaryls, in which the ethynylaryls comprise one of ethynylphenyl, ethynyithiophene, and ethynylpyridine, and
wherein the acid labile group comprises one of tetrahydropyranyl, and 1-methylcyclopentyl, and the acid labile group comprises a protecting group for phenols, substituted phenols, alkyl carboxylic acids, and aryl carboxylic acids.

4. The photosensitive compound of claim 1, wherein each of X and Y comprises one of $CR^7$, N, O, S, SO, and $SO^2$, and each of $R^1$, $R^2$, and $R^7$ comprises one of hydrogen, alkyls of 1–12 carbon atoms, aryls, substituted aryls, aralkyls, alkoxycarbonyls, aryloxycarbonyls, and acyls.

5. The photosensitive compound of claim 4, wherein the acyls are represented by the formula $R^8CO—$, and $R^8$ comprises one of hydrogen, alkyls of 1–12 carbon atoms, aryls, aralkyls, fluoroalkyls, and substituted aryls, in which the substituted aryls have a substituent comprising one of F, Cl, Br, $NO_2$, $CO_2R$, $PO_3H$, $SO_3H$, trialkylsilyl, and acyl.

6. The photosensitive compound of claim 1, wherein the photosensitive functionality represents a photopolymerizable group comprising one of acrylates, methacryaltes, styryls, substituted styryls, and ethynylaryls, in which the ethynylaryls comprise one of ethynyiphenyl, ethynyithiophene, and ethynylpyridine.

7. The photosensitive compound of claim 1, wherein the acid labile group comprises one of tetrahydropyranyl, tert-butyloxycarbonyl, and 1-methylcyclopentyl, and the acid labile group comprises a protecting group for phenols, substituted phenols, alkyl carboxylic acids, and aryl carboxylic acids.

8. The photosensitive compound of claim 1, wherein the photosensitive functionality represents a photopolymerizable group comprising one of styryls, substituted styryls, and ethynylaryls, in which the ethynylaryls comprise one of ethynyiphenyl, ethynyithiophene, and ethynylpyridine, and
   wherein the acid labile group comprises one of tetrahydropyranyl, and 1-methylcyclopentyl, and the acid labile group comprises a protecting group for phenols, substituted phenols, alkyl carboxylic acids, and aryl carboxylic acids.

9. A photosensitive compound formed by a Diels-Alder adduct of a polycyclic aromatic compound and a dienophile, the polycyclic aromatic compound being represented by the formula

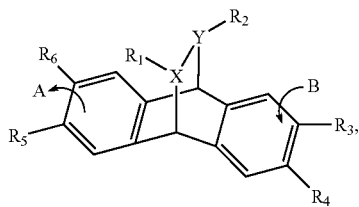

wherein each of A and B comprises an aromatic ring compound comprising one of benzene, naphthalene, anthracene, and phenanthrene, and heteroaromatic ring compounds comprising one of thiophene, bithiophene, benzothiophene, and pyridine,
wherein at least one of X and Y comprises a hetero atom comprising one of O, N and S, and
wherein at least one of R1 and R2 has at least one of a photosensitive functionality and an acid labile group.

10. The photosensitive compound of claim 9, wherein each of R1 and R2 comprises one of hydrogen, alkyls of 1–12 carbon atoms, aryls, substituted aryls, aralkyls, alkoxycarbonyls, aryloxycarbonyls, and acyls, the acyls being represented by the formula $R^8CO$—, in which $R^8$ comprises one of hydrogen, alkyls of 1–12 carbon atoms, aryls, aralkyls, fluoroalkyls, and substituted aryls, in which the substituted aryls have a substituent comprising one of F, Cl, Br, $NO_2$, $CO_2R$, $PO_3H$, $SO_3H$, trialkylsilyl, and acyl.

11. The photosensitive compound of claim 9, wherein each of R3, R4, R5, and R6 comprises a group including hydrogen, alkyls of 1–12 carbon atoms, aryls, substituted aryls, and a group in which R3 and R4 form one or more fused aromatic-rings.

12. The photosensitive compound of claim 9, wherein the photosensitive functionality represents a photopolymerizable group comprising one of acrylates, methacryaltes, styryls, substituted styryls, and ethynylaryls, in which the ethynylaryls comprise one of ethynylphenyl, ethynyithiophene, and ethynylpyridine.

13. The photosensitive compound of claim 9, wherein the acid labile group comprises one of tetrahydropyranyl, tert-butyloxycarbonyl, and 1-methylcyclopentyl, and the acid labile group comprises a protecting group for phenols, substituted phenols, alkyl carboxylic acids, and aryl carboxylic acids.

14. The photosensitive compound of claim 9, wherein the photosensitive functionality represents a photopolymerizable group comprising one of styryls, substituted styryls, and ethynylaryls, in which the ethynylaryls comprise one of ethynylphenyl, ethynylthiophene, and ethynylpyridine, and
   wherein the acid labile group comprises one of tetrahydropyranyl, and 1-methylcyclopentyl, and the acid labile group comprises a protecting group for phenols, substituted phenols, alkyl carboxylic acids, and aryl carboxylic acids.

15. A photosensitive compound formed by a Diels-Alder adduct of a polycyclic aromatic compound and a heterodienophile having the structure $$R^1\text{—}X\text{=}Y\text{—}R^2,$$

wherein each of X and Y comprise one of $CR^3$, O, N, and S and at least one of X and Y comprises a hetero atom of O, N, and S, and
wherein each of $R^1$, and $R^2$ comprise one of hydrogen, alkyl groups of 1–12 carbon atoms, partially- or fruly-fluorinated alkyls of 1–12 carbon atoms, acyls, aryls, aralkyls, phosphonates, carboxylates, and
wherein at least one of $R^1$, and $R^2$ comprises at least one of a photosensitive group and an acid labile group.

16. The photosensitive compound of claim 15, wherein the photosensitive functionality represents a photopolymerizable group comprising one of styryls, substituted styryls, and ethynylaryls, in which the ethynylaryls comprise one of ethynylphenyl, ethynylthiophene, and ethynylpyridine, and
   wherein the acid labile group comprises one of tetrahydropyranyl, and 1-methylcyclopentyl, and the acid labile group comprises a protecting group for phenols, substituted phenols, alkyl carboxylic acids, and aryl carboxylic acids.

* * * * *